US012624287B2

(12) United States Patent
Oh et al.

(10) Patent No.: US 12,624,287 B2
(45) **Date of Patent: \*May 12, 2026**

(54) COMPOSITION FOR THE SELECTIVE ETCHING OF SILICON

(71) Applicants: ENF TECHNOLOGY CO., LTD., Gyeonggi-do (KR); SK hynix Inc., Gyeonggi-do (KR)

(72) Inventors: Jeong Sik Oh, Gyeonggi-do (KR); Tae Ho Kim, Gyeonggi-do (KR); Gi young Kim, Gyeonggi-do (KR); Myung Ho Lee, Gyeonggi-do (KR); Myung Geun Song, Gyeonggi-do (KR); Pilgu Kang, Gyeonggi-do (KR); Youngmee Kang, Gyeonggi-do (KR); Eunseok Oh, Gyeonggi-do (KR)

(73) Assignees: ENF TECHNOLOGY CO., LTD., Gyeonggi-do (KR); SK hynix Inc., Gyeonggi-do (KR)

( \* ) Notice: Subject to any disclaimer, the term of this patent is extended or adjusted under 35 U.S.C. 154(b) by 11 days.

This patent is subject to a terminal disclaimer.

(21) Appl. No.: 17/903,104

(22) Filed: Sep. 6, 2022

(65) Prior Publication Data

US 2023/0092160 A1 Mar. 23, 2023

(30) Foreign Application Priority Data

Sep. 13, 2021 (KR) ........................ 10-2021-0121626

(51) Int. Cl.
 *C09K 13/08* (2006.01)
 *H10P 50/64* (2026.01)
(52) U.S. Cl.
 CPC ............ *C09K 13/08* (2013.01); *H10P 50/642* (2026.01)

(58) Field of Classification Search
 None
 See application file for complete search history.

(56) References Cited

U.S. PATENT DOCUMENTS

| | | | |
|---|---|---|---|
| 11,035,044 B2 * | 6/2021 | Liu | ........................... C23F 1/38 |
| 2004/0224866 A1 * | 11/2004 | Matsunaga | .............. C11D 3/30 510/175 |
| 2016/0083650 A1 * | 3/2016 | Sugishima | ........ H01L 21/32134 252/79.3 |
| 2019/0074188 A1 * | 3/2019 | Cooper | ............. H01L 21/30604 |
| 2019/0284704 A1 * | 9/2019 | Ge | .................... H01L 21/32134 |
| 2020/0148951 A1 | 5/2020 | Park et al. | |
| 2020/0157422 A1 * | 5/2020 | Liu | ....................... H10D 64/017 |
| 2021/0108140 A1 * | 4/2021 | Kim | ...................... C07F 7/0836 |
| 2021/0202264 A1 | 7/2021 | Kim et al. | |

FOREIGN PATENT DOCUMENTS

| | | |
|---|---|---|
| KR | 10-2016-0006217 A | 1/2016 |
| KR | 10-2020-0056539 A | 5/2020 |
| KR | 10-2020-0107139 A | 9/2020 |
| KR | 10-2021-0084018 A | 7/2021 |

OTHER PUBLICATIONS

Office Action from corresponding Korean Patent Application No. 10-2021-0121626 dated Jun. 25, 2025. (Google Translation).

\* cited by examiner

*Primary Examiner* — Shamim Ahmed
(74) *Attorney, Agent, or Firm* — Christensen, Fonder, Dardi, Busse; Diane E. Bennett; Peter S. Dardi

(57) ABSTRACT

Silicon etching compositions are described and may be used for selectively etching silicon with respect to a metal film. In particular, the silicon etching compositions can be used to improve the selective etching ratio of silicon from the surface of a semiconductor on which the metal film and silicon are exposed.

21 Claims, No Drawings

COMPOSITION FOR THE SELECTIVE ETCHING OF SILICON

CROSS REFERENCE TO RELATED APPLICATIONS

This application claims the benefits of priority to Korean Patent Application No. 10-2021-0121626, filed Sep. 13, 2021, incorporated herein by reference.

TECHNICAL FIELD

The present invention relates to a composition for selectively etching silicon on a surface on which a metal film and silicon (Si) are exposed.

BACKGROUND ART

Tungsten (W) is used as a representative plug metal in the semiconductor field.

Meanwhile, an acidic etchant of silicon comprises etching species such as hydrofluoric acid and oxidizing species such as nitric acid and sulfuric acid, for example.

The acidic etchant has a problem in that the defect rate increases because of the low selectivity of silicon with respect to the tungsten film in the silicon bulk etching of the semiconductor manufacturing process. In particular, as a metal such as tungsten is etched non-selectively, a detect may occur in a subsequent process such as the exposed lower pattern and a short circuit. This problem of the acidic etchant is a limiting factor in the application of the acidic etchant in processes such as semiconductor packaging and Through Silicon Via (TSV).

Therefore, it is necessary to study a composition that has a very low etch rate of the metal film and can selectively etch only silicon.

DETAILED DESCRIPTION OF THE INVENTION

Technical Problem

It is an object of the present invention to provide a composition having the improved etch selectivity of silicon to a metal film.

Solution to Problem

In order to solve the above problems, the present invention provides a composition for selective etching of silicon, comprising:
    a fluorine compound;
    nitric acid;
    acetic acid;
    phosphoric acid; and
    an organic amine compound.

According to one embodiment, the fluorine compound may comprise one or more of hydrofluoric acid, ammonium bifluoride, sodium fluoride, potassium fluoride, aluminum fluoride, fluoroboric acid, ammonium fluoride, sodium bifluoride, potassium bifluoride, and ammonium tetrafluoroborate.

According to one embodiment, the organic amine compound may comprise one or more of polyethyleneimine, octylamine, polypropyleneimine, pentaethylenehexamine, N,N'-bis(2-aminoethyl)-1,3-propanediamine, N-(2-aminoethyl)-1,3-propanediamine, N-(3-aminopropyl)-1,3-propanediamine, spermine, spermidine, 1,4-bis(3-aminopropyl) piperazine, 1-(2-aminoethyl)piperazine, tris(2-aminoethyl) amine, branched or dendritic polyamidoamine, dendritic poly(propyleneimine) (DAB-am-16), poly(L-lysine) and chitosan.

According to one embodiment, the organic amine compound may comprise polyethyleneimine According to one embodiment, the organic amine compound may have a molecular weight Mw of 300 to 20,000.

According to one embodiment of the present invention, the etch rate of silicon may be 3 μm/min or more, and the etch selectivity of silicon to the metal film may be 100 or more.

According to other embodiment of the present invention, there is provided a method for preparing a composition for selective etching of silicon, comprising mixing:
    0.5 to 10% by weight of a fluorine compound;
    15 to 55% by weight of nitric acid;
    1 to 20% by weight of acetic acid;
    5 to 15% by weight of phosphoric acid; and
    0.001 to 10% by weight of an organic amine compound.

According to another embodiment of the present invention, there is provided a semiconductor device manufactured using the composition for selective etching of silicon as described above.

The specific details of other embodiments according to the present invention are included in the detailed description below.

Effect of the Invention

According to the present invention, it is possible to improve etch selectivity of silicon on the semiconductor surface on which both of a metal film and silicon are exposed.

Best Mode for Carrying out the Invention

The present invention may have various modification and various embodiments, and specific embodiments will be illustrated and described in detail. However, it is not intended to limit the present invention to specific embodiments, and should he understood to include all modifications, equivalents, and substitutes included in the spirit and scope of the present invention. In describing the present invention, if it is determined that a detailed description of a related known technology may obscure the gist of the present invention, the detailed description thereof will be omitted.

As used herein, unless otherwise specified, the expression "to" in relation to a number is used as an expression including the corresponding numerical value. Specifically, for example, the expression "1 to 2" is meant to include all numbers between 1 and 2 as well as 1 and 2.

In a semiconductor, silicon is oxidized to a silicon oxide film by oxidizing species generated from an oxidizing agent and an auxiliary oxidizing agent. The oxidized silicon oxide film is etched by contact with an etchant. When etching silicon, it is necessary to consider the selective etching amount of silicon to the metal film in order to minimize defects in the lower pattern and wiring short circuit.

In the present invention, it is intended to improve the selective etching effect of silicon to the metal film by providing a specific combination of additives.

Hereinafter, the composition for the selective etching of silicon according to embodiments of the present invention will be described in more detail.

Specifically, the present invention provides a composition for selective etching of silicon, comprising:

a fluorine compound;

nitric acid;

acetic acid;

phosphoric acid; and an organic amine compound.

According to one embodiment, the fluorine compound, which is a compound that dissociates to generate $F^-$ or $HF^{2-}$ having strong affinity with silicon, serves to etch the silicon oxide film. The fluorine compound may comprise one or more of hydrofluoric acid (HF), ammonium bifluoride (ABF; $NH_4HF_2$), sodium fluoride (NaF), potassium fluoride (KF), aluminum fluoride ($AlF_3$), fluoroboric acid ($HBF_4$), ammonium fluoride ($NH_4F$), sodium bifluoride ($NaHF_2$), potassium bifluoride ($KHF_2$) and ammonium tetrafluoroborate ($NH_4BF_4$). Specifically, it may comprise one or more of hydrofluoric acid, ammonium fluoride, and ammonium bifluoride, for example.

The content of the fluorine compound may be from 0.5 to 10% by weight, for example 2% by weight or more, 4% by weight or more, 5% by weight or more, and for example 8% by weight or less, 7% by weight or less. Within this content range, it is suitable for etching the silicon film with respect to the metal film.

According to one embodiment, the metal film may comprise one or more of tungsten (W), titanium nitride (TiN), titanium (Ti), gold (Au), molybdenum (Mo), nickel (Ni), palladium (Pd), and platinum (Pt), specifically, for example, tungsten.

The nitric acid according to the present invention may serve to oxidize silicon to etch silicon more effectively. The content of nitric acid may be from 15 to 55% by weight, for example 20% by weight or more, 30% by weight or more, 40% by weight or more, 50% by weight or more, and for example 55% by weight or less.

The acetic acid according to the present invention may serve to prevent the decomposition of nitric acid. The content of acetic acid may be from 1 to 20% by weight, for example 2% by weight or more, 3% by weight or more, and for example 15% by weight or less, 10% by weight or less, 8% by weight or less, 6% by weight or less.

The present invention may comprise phosphoric acid and an organic amine compound as an additive.

The phosphoric acid may serve to control the viscosity. The content of phosphoric acid may he from 5 to 15% by weight, for example 6% by weight or more, 8% by weight or more, and for example 13% by weight or less.

The organic amine compound serves to improve the etch selectivity of silicon to the metal film. The organic amine compound may comprise a cationic additive, for example it may comprise one or more of polyethyleneimine (PEI), octylamine, poly(propyleneimine) (PPI), pentaethylene hexamine, N,N'-bis(2-aminoethyl)-1,3-propanediamine, N-(2-aminoethyl)-1,3-propanediamine, N-(3-aminopropyl)-1,3-propanediamine, spermine, spermidine, 1,4-bis(3-aminopropyl)piperazine, 1-(2-aminoethyl)piperazine, tris(2-aminoethyl)amine, branched or dendritic polyamidoamine (PAMAM), dendritic poly(propyleneimine) (DAB-am-16), poly(L-lysine) (PLL) and chitosan, specifically, for example, it may comprise polyethyleneimine, polypropyleneimine, octylamine or a combination thereof, and in particular, for example, it may comprise polyethyleneimine.

According to one embodiment, when the organic amine compound is polyethyleneimine, it may have a molecular weight of Mw 300 to 20,000, for example, Mw 400 or more, Mw 500 or more, or Mw 600 or more, and for example, Mw 15,000 or less, Mw 12,000 or less, Mw 10,000 or less.

In addition, the content of the organic amine compound may be from 0.001 to 10% by weight, for example, 0.005% by weight or more, 0.01% by weight or more, 0.03% by weight or more, and for example, 5% by weight or less, 3% by weight or less, 1% by weight or less.

The present invention can improve the selective etching amount of silicon to the metal film due to the inclusion of phosphoric acid and the organic amine compound. In particular, the organic amine compound can physically adsorb to the metal surface, thereby reducing the oxidation rate of the metal. As a result, it is possible to effectively improve the etch selectivity of silicon to the metal film by lowering the etch rate of the metal film.

According to one embodiment, when treating the substrate in which the metal film and silicon are simultaneously exposed on die surface according to the present invention, the etch rate of silicon may be 3 µm/min or more, 5 µm/min or more, such as 6 µm/min or more, such as 8 µm/min or more, and for example 30 µm/min or less, 20 µm/min or less, or 15 µm/min or less.

In addition, the etching selectivity Si/W of silicon (Si) to the tungsten (W) film may be for example 100 or more, 300 or more, 500 or more, and for example 1200 or less, 1100 or less, 1000 or less.

According to one embodiment, the amount of water such that the total weight of the composition is 100% by weight may be included. The water to be used is not particularly limited, but deionized water may be used. Preferably, deionized water having a specific resistance value of 18 MΩ/cm or more which indicates the degree of removal of ions in water, may be used.

According to one embodiment, the composition of the present invention may further comprise any additives used in a conventional etchant composition in order to improve etching performance. For example, it may further comprise one or more selected from the group consisting of a stabilizer, a surfactant, a chelating agent, an antioxidant, a corrosion inhibitor, and a mixture thereof.

The stabilizer may be an etching stabilizer and may be added in order to suppress the generation of side reactions or byproducts that may be accompanied by unnecessary reactions of the etchant composition or the object to be etched.

The surfactant may be additionally added for the purpose of improving wettability of the etchant composition, improving foam properties of the additive, and increasing solubility of other organic additives. The surfactant may be 1 or 2 or more selected from nonionic surfactants, anionic surfactants, cationic surfactants, and amphoteric surfactants, and may be added in an amount of 0.0005 to 5% by weight based on the total weight of the composition, preferably 0.001 to 2% by weight based on the total weight of the composition. When the content of the surfactant is less than 0.0005% by weight based on the total weight of the composition, no effect can be expected, and when the content of the surfactant exceeds 5% by weight, solubility problems may occur, or process problems may occur due to excessive foaming.

The chelating agent may be additionally added for the purpose of increasing the solubility of metal impurities of the etchant composition or forming a uniform etched surface. The chelating agent may be added in an amount of 0.1 to 5% by weight based on the total weight of the composition, and may preferably be an organic acid having both of a carboxyl group and a hydroxyl group.

The antioxidant and the corrosion inhibitor may be added in order to protect metals or metallic compounds used as materials for semiconductor devices. The antioxidant and the corrosion inhibitor may be used without limitation as long as they are commonly used in the art. For example, it may include, but not limited to, an azole-based compound, and may be added in an amount of 0.01 to 10% by weight based on the total weight of the composition.

According to another embodiment of the present invention, there is provided a semiconductor element or a semiconductor device manufactured using the composition for selective etching of silicon as described above. In addition, it is possible to provide a method of manufacturing a semiconductor element or a semiconductor device using the composition for selective etching of silicon of the present invention.

The etching method using the etching composition of the present invention may be performed according to a conventional method, and is not particularly limited.

Hereinafter, embodiments of the present invention will be described in detail so that those of ordinary skill in the art can easily carry out the present invention. However, the present invention may be embodied in several different forms and is not limited to the embodiments described herein.

EXAMPLE AND COMPARATIVE EXAMPLE

A composition for selective etching of silicon was prepared with the composition shown in Table 1. Each composition comprises the amount of water such that the total weight of the composition is 100% by weight.

TABLE 1

| | Content (wt %) | | | | | |
|---|---|---|---|---|---|---|
| | Hydrofluoric acid | Nitric acid | Phosphoric acid | Acetic acid | Additive | Additive type |
| Comparative Example 1 | 6.8 | 52.0 | 0.0 | 4.8 | | |
| Comparative Example 2 | 6.8 | 15.0 | 9.7 | 4.8 | | |
| Comparative Example 3 | 1.0 | 52.0 | 9.7 | 4.8 | | |
| Comparative Example 4 | 6.8 | 52.0 | 9.7 | 4.8 | | |
| Comparative Example 5 | 6.8 | 52.0 | 9.7 | 4.8 | 0.1 | Dodecyl Benzene sulfonic acid |
| Example 1 | 6.8 | 52.0 | 9.7 | 4.8 | 0.05 | PEI-600 |
| Example 2 | 6.8 | 52.0 | 9.7 | 4.8 | 0.1 | PEI-600 |
| Example 3 | 6.8 | 52.0 | 9.7 | 4.8 | 0.2 | PEI-600 |
| Example 4 | 6.8 | 52.0 | 9.7 | 4.8 | 0.1 | PEI-10000 |
| Example 5 | 6.8 | 52.0 | 9.7 | 4.8 | 0.2 | PEI-10000 |
| Example 6 | 6.8 | 52.0 | 9.7 | 4.8 | 0.1 | Octylamine |

Experimental Example 1: Evaluation of Etch Rate

In order to determine die etch rate for each composition, the substrate to be evaluated having both tungsten (W) and silicon exposed on the surface was cut to 20×20 mm, and the thickness and weight of each substrate were measured. The etchant composition according to each of Examples and Comparative Examples was introduced into a thermostat maintained at 25° C. and the substrate to be evaluated was immersed for 15 minutes to carry out the etching process. After the etching was completed, the substate was washed with ultrapure water and then the remaining etchant composition and moisture were completely dried using a drying device. Then, the weight of the dried substrate was measured, the weight change before and after evaluation was calculated, and the etch rate was measured using Equation 1 below.

$$\text{(Initial substrate thickness×weight reduction rate)/Processing time=Etch rate} \qquad \text{[Equation 1]}$$

The results are shown in Table 2.

TABLE 2

| | Etch rate (um/min) | | Selectivity |
|---|---|---|---|
| | Si | W | Si/W |
| Comparative Example 1 | 2.12 | 0.02 | 106 |
| Comparative Example 2 | 0.00 | 0.00 | 0.00 |
| Comparative Example 3 | 0.00 | 0.00 | 0.00 |
| Comparative Example 4 | 10.13 | 0.23 | 44 |
| Comparative Example 5 | 7.41 | 0.22 | 33 |
| Example 1 | 10.05 | 0.02 | 505 |
| Example 2 | 10.09 | 0.01 | 770 |
| Example 3 | 10.03 | 0.01 | 865 |
| Example 4 | 10.01 | 0.01 | 715 |
| Example 5 | 10.03 | 0.01 | 772 |
| Example 6 | 10.3 | 0.07 | 147 |

As shown in Table 2, in the case of Comparative Examples, the etching was not sufficiently performed. In Comparative Examples 2 and 3, etching was hardly performed on both of the metal film and silicon, and in Comparative Example 1, the etch selectivity of silicon was high, but the etch rate of silicon was about 2 μm/min, which is about 5 times lower than that of Example. In addition, in Comparative Examples 4 and 5, the etch selectivity was not high enough to be suitable for the etchant composition.

On the other hand, from the results according to Examples containing the cationic surfactant, it is confirmed that the etch rate of silicon is 10 μm/min or more and the selectivity Si/W is 100 or more.

In particular, in the case of Examples 1 to 5 containing polyethyleneimine, itis confirmed that the silicon etch selectivity is excellent as 700 or more.

Therefore, the etchant composition according to the present invention improves the etch selectivity of silicon to the metal film effectively by lowing the etch rate of the metal film.

As described above, the specific parts of the present invention have been described in detail, and for those of ordinary skill in the art to which the present invention pertains, it is clear that these specific techniques are only preferred embodiments and the scope of the present invention is not limited thereto. Those of ordinary skill in the art to which the present invention pertains will be able to make various applications and modifications within the scope of the present invention based on the above contents. Accordingly, the substantial scope of the present invention will be defined by the appended claims and their equivalents.

What is claimed is:

1. A composition for selective etching of silicon, comprising:
   about 0.5 to about 10% by weight of a fluorine compound;
   about 30 to about 55% by weight of nitric acid ($HNO_3$);
   about 1 to about 8% by weight of acetic acid ($CH_3COOH$);
   about 5 to about 15% by weight of phosphoric acid ($H_3PO_4$); and
   about 0.001 to about 10% by weight of an organic amine compound,
   wherein the organic amine compound comprises one or more of polyethyleneimine, octylamine, polypropyleneimine, pentaethylenehexamine, N,N'-bis(2-aminoethyl)-1,3-propanediamine, N-(2-aminoethyl)-1,3-propanediamine, N-(3-aminopropyl)-1,3-propanediamine, spermine, spermidine, 1,4-bis(3-aminopropyl)piperazine, 1-(2-aminoethyl)piperazine, tris(2-aminoethyl) amine, branched or dendritic polyamidoamine, dendritic poly(propyleneimine) (DAB-am-16), poly(L-lysine) and chitosan.

2. The composition for selective etching of silicon according to claim 1, wherein the fluorine compound comprises one or more of hydrofluoric acid, ammonium bifluoride, sodium fluoride, potassium fluoride, aluminum fluoride, fluoroboric acid, ammonium fluoride, sodium bifluoride, potassium bifluoride, and ammonium tetrafluoroborate.

3. The composition for selective etching of silicon according to claim 1, wherein the organic amine compound has a molecular weight Mw of 300 to 20,000.

4. The composition for selective etching of silicon according to claim 1, wherein the etch rate of silicon is 3 µm/min or more, and the etch selectivity of silicon to a metal film is 100 or more.

5. The composition for selective etching of silicon according to claim 1, wherein the etch selectivity of silicon to a metal film is from about 100 to about 1200.

6. The composition for selective etching of silicon according to claim 1, wherein the fluorine compound comprises hydrofluoric acid.

7. The composition for selective etching of silicon according to claim 1, wherein the organic amine compound comprises polyethyleneimine, octylamine, or a combination thereof.

8. The composition for selective etching of silicon according to claim 1, further comprising water.

9. The composition for selective etching of silicon according to claim 1, wherein the composition is free of water.

10. The composition for selective etching of silicon according to claim 1, wherein the composition comprises nitric acid and acetic acid in a ratio from about 3 to about 15.

11. The composition of claim 1, wherein the composition comprises at least 90% by weight of acid.

12. The composition for selective etching of silicon according to claim 1, wherein the composition comprises from 6 to about 15% by weight of phosphoric acid ($H_3PO_4$).

13. The composition for selective etching of silicon according to claim 1, wherein the composition selectively etches silicon relative to a metal film.

14. The composition for selective etching of silicon according to claim 13, wherein the metal film comprises one or more of tungsten (W), titanium nitride (TiN), titanium (Ti), gold (Au), molybdenum (Mo), nickel (Ni), palladium (Pd), and platinum (Pt).

15. The composition for selective etching of silicon according to claim 13, wherein the metal film comprises tungsten (W).

16. A semiconductor device manufactured using the composition for selective etching of silicon of claim 1.

17. A method for preparing a composition for selective etching of silicon, comprising mixing:
   0.5 to 10% by weight of a fluorine compound;
   30 to 55% by weight of nitric acid ($HNO_3$);
   1 to 8% by weight of acetic acid ($CH_3COOH$);
   5 to 15% by weight of phosphoric acid ($H_3PO_4$); and
   0.001 to 10% by weight of an organic amine compound,
   wherein the organic amine compound comprises one or more of polyethyleneimine, octylamine, polypropyleneimine, pentaethylenehexamine, N,N'-bis(2-aminoethyl)-1,3-propanediamine, N-(2-aminoethyl)-1,3-propanediamine, N-(3-aminopropyl)-1,3-propanediamine, spermine, spermidine, 1,4-bis(3-aminopropyl)piperazine, 1-(2-aminoethyl)piperazine, tris(2-aminoethyl) amine, branched or dendritic polyamidoamine, dendritic poly(propyleneimine) (DAB-am-16), poly(L-lysine) and chitosan.

18. The method of claim 17, wherein a ratio of the nitric acid to the acetic acid is from about 3 to about 15% by weight.

19. The method of claim 17, wherein the composition comprises at least 90% by weight of acid.

20. The method of claim 17, further comprising mixing water such that the total weight of the composition is 100%.

21. The method of claim 17, wherein the method comprises mixing from 6 to about 15% by weight of phosphoric acid ($H_3PO_4$).

* * * * *